United States Patent [19]

Kasten

[11] Patent Number: 4,536,231

[45] Date of Patent: Aug. 20, 1985

[54] POLYSILICON THIN FILMS OF IMPROVED ELECTRICAL UNIFORMITY

[75] Inventor: Alan J. Kasten, Palm Bay, Fla.

[73] Assignee: Harris Corporation, Melbourne, Fla.

[21] Appl. No.: 612,877

[22] Filed: May 22, 1984

Related U.S. Application Data

[62] Division of Ser. No. 435,221, Oct. 19, 1982, Pat. No. 4,466,179.

[51] Int. Cl.[3] .................. H01L 21/265; H01L 21/263
[52] U.S. Cl. .................. 148/33.1; 29/576 B; 29/576 T; 148/1.5; 148/187; 148/DIG. 93; 357/91; 427/53.1
[58] Field of Search .............. 148/1.5, 33.1, 187; 29/576 B, 576 T; 427/53.1; 357/91

[56] References Cited

U.S. PATENT DOCUMENTS

| | | | |
|---|---|---|---|
| 4,198,246 | 4/1980 | Wu | 148/1.5 |
| 4,309,224 | 1/1982 | Shibata | 148/1.5 |
| 4,309,225 | 1/1982 | Fan et al. | 148/1.5 |
| 4,315,130 | 2/1982 | Inagaki et al. | 219/121 L |
| 4,330,363 | 5/1982 | Biegesen et al. | 156/620 |
| 4,372,990 | 2/1983 | Lam | 427/53.1 |
| 4,394,191 | 7/1983 | Wada et al. | 148/33.1 |
| 4,406,709 | 9/1983 | Celler et al. | 148/1.5 |

FOREIGN PATENT DOCUMENTS

| | | | |
|---|---|---|---|
| 148431 | 11/1980 | Japan | 29/576 T |
| 97620 | 6/1982 | Japan | 29/576 T |

OTHER PUBLICATIONS

Stültz et al., in "Laser & Electron Beam . . . Solids" ed. Appleton et al., Elsevier, N.Y. 1981, p. 499.
Gibbons et al., Appl. Phys. Letts., 34 (1979) 831.

Primary Examiner—Upendra Roy
Attorney, Agent, or Firm—Barnes & Thornburg

[57] ABSTRACT

A method for forming a polysilicon thin film semiconductor device precursor, and the precursor, are disclosed, wherein the deposited thin film layer is scanned with a continuous wave laser in a first direction, and scanned a second time in a direction different from that of the first direction. The cross-scanning reduces the anisotropy of the thin film produced by the first scanning and apparently induces larger grain size in the recrystallized polysilicon.

5 Claims, 2 Drawing Figures

FIG.1
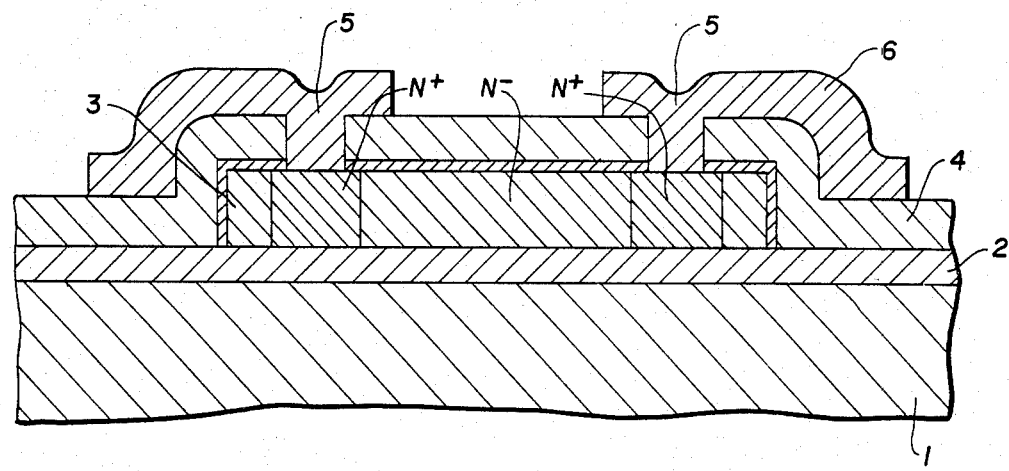
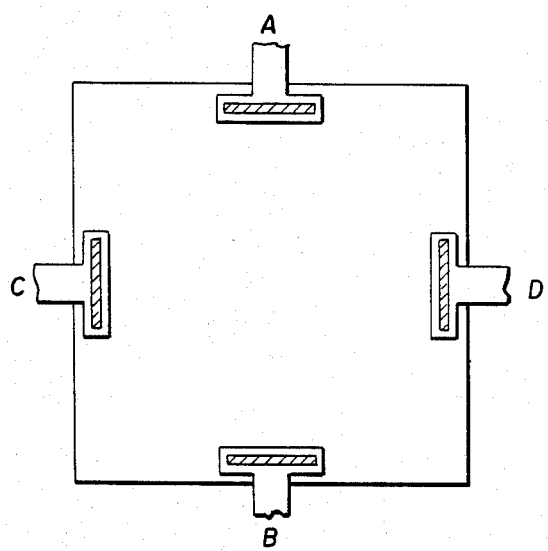
FIG.2

POLYSILICON THIN FILMS OF IMPROVED ELECTRICAL UNIFORMITY

This is a divisional of application Ser. No. 435,221, filed Oct. 19, 1982, now U.S. Pat. No. 4,466,179.

FIELD OF THE INVENTION

This invention relates to the art of fabricating silicon integrated circuit precursors and associated devices, and specifically, to the use of a continuous wave laser for annealing thin films of polysilicon in such devices.

BACKGROUND OF THE INVENTION

The use of lasers to melt and recrystallize polysilicon thin films in various silicon semiconducting devices has received increased attention in the semiconductor industry over the past few years. Polysilicon, as deposited using low pressure chemical vapor deposition (LPCVD) or other techniques, has serious drawbacks which limit its use for thin film resistors or active devices such as transistors. The main problem with the deposited film is that it generally consists of many small, randomly aligned crystallites separated by small grain boundries which can be practically considered as defects in the thin film. The grain boundries act as trapping centers, preventing polysilicon films from being used in active areas of devices, such as the base of a bipolar transistor, due to the extremely low minority carrier life time in the polysilicon. The grain boundaries are also the cause of a conductive mechanism for majority carriers which is extremely temperature-sensitive, resulting in high negative temperature coefficients when these films are used in thin film resistors, substantially detracting from their value.

One approach to eliminating these problems has been to melt the polysilicon and allow it to recrystallize in larger grains, thus reducing the density of the above-described boundries and improving the electrical characteristics of the film. One method of melting and recrystallizing which has received substantial attention throughout the industry is the use of laser irradiation, particularly continuous wave lasers. Unfortunately, it has been discovered that this technology suffers from its own drawbacks.

One problem encountered in using a scanned continuous wave (CW) laser for melting and recrystallization of polysilicon films is that this technique generally induces severe electrical anisotropy in the film. The conventional technique for scanning the laser beam across the semiconductor wafer is believed responsible for this effect. The laser beam is usually scanned in one direction across the wafer. Since the width of the laser beam is very small, the beam is scanned many times, each time stepping the beam a small distance in a direction perpendicular to the scan, in order to cover the entire wafer. This results in many parallel, closely spaced lines of recrystallized polysilicon grains on the wafer. When a CW laser is used, the polysilicon grains recrytallize in long, thin crystallites in parallel array along the scan lines. It is this structure that is believed responsible for the severe electrical anisotropy found in such films. Electricity flows much more easily along the parallel lines of crystallites generated by the scan line than across them, because the density of the grain boundaries across the scan lines is much higher than that along the scan line. The electrical anisotropy induced is a reflection of the spatial anisotropy of the grains generated by parallel laser scan lines.

Accordingly, it is one object of this invention to provide a process for the melting and recrystallization of polysilicon films that does not induce electrical anisotropy into the film.

A second object of this invention is to provide a process of melting and recrystallization of polysilicon that increases the grain size of the recrystallized polysilicon over that obtainable by conventional processes, thereby reducing the sheet resistance of the treated film.

Other objects of the invention will be apparent from its description set forth below.

SUMMARY OF THE INVENTION

The severe electrical anisotropy introduced in polysilicon thin films which have been melted and recrystallized through the use of a CW laser can be overcome by scanning the film a second time in a direction at an angle to that of the first scan. This second scan causes the recrystallized grains to orient themselves in a direction other than that parallel to the original scan lines, and also appears to increase the grain size of the recrystallized polysilicon in the semiconductor device precursor so formed.

BRIEF DESCRIPTION OF THE DRAWINGS

FIG. 1 is a schematic representation of the semiconductor device prepared to demonstrate the process of the invention.

FIG. 2 is a representative drawing of the apparatus employed to measure the resistance of the product of the process of this invention.

DETAILED DESCRIPTION OF THE INVENTION

It has been discovered that the electrical anisotropy introduced into polysilicon thin films by scanning in one direction with a CW laser can be overcome by scanning in a second direction, or "cross-scanning". This cross-scanning tends to eliminate the spatial anisotropy introduced by the original scan, thereby removing the electrical anisotropy discussed above.

The polysilicon film is first scanned with the continuous wave laser in conventional fashion, i.e., in narrow, closely spaced parallel lines across the entire wafer. The once-scanned polysilicon film is then scanned again, using a CW laser. The second scan direction is at an angle to that of the first scan, the bias being introduced most easily by rotation of the wafer after the first scan is completed.

The melting and recrystallization caused by the second scan allows for recrystallized grains to be formed in such a fashion that they are not exclusively oriented along parallel scan lines, either those of the first or second scanning. Although it will be apparent that any angle of bias between the first and second scanning will avoid uniform parallel orientation of the grains, a rotation of the wafer by 90°, so that the second set of scan lines is perpendicular to the first, is a preferred embodiment. In this embodiment, the electrical anisotropy of the film, as illustrated by the difference in resistance across the film in orthogonal directions, can be reduced below 2%.

It has been discovered that not only does this technique result in a large reduction in the electrical anisotropy observed after a single scanning, and the uniformity of the sheet resistance throughout the film after subsequent processing to form thin film resistors being also improved; but it is also believed the same cross-scanning technique generates grains of increased size when compared with single scanning techniques, contributing to a reduction in the sheet resistance of the film.

The advantages of the process of this invention can be further understood with reference to the specific examples set forth below.

EXAMPLE 1

In order to compare the performance of polysilicon thin films irradiated according to the process of this invention with those of prior art processes, the following experiment was performed, illustrated in FIG. 1.

A first lot 1 of wafers was produced, starting with substrates 1 of N type, 3–5 ohm-cm, <1-0-0> silicon. It should be understood that this type of substrate is example only, the process being susceptible in application to a wide variety of substrates. These substrates were oxidized to grow a thermal oxide layer 2 of about 1,000 Å. 3,000 Å of LPCVD polysilicon 3 was then deposited on the oxide. The wafers were then irradiated with a CW argon laser to melt and recrystallize the polysilicon film. The wafers were then rotated 90° and scanned in a direction perpendicular to the first scanning, or cross-scanned. The wafers were then ion implanted with phosphorous at a potential of 65 KeV. The wafers received a dose of 5E13 ions/cm$^2$. A thin film resistor pattern was then delineated on the polysilicon film, the wafers were oxidized, and 2,000 Å of silicon nitride 4 was deposited to act as a passivation layer for the resistors.

Contact apertures 5 were etched through the nitride layer and a phosphorous deposition was performed to allow ohmic contact to be made to the ends of the resistors. Interconnect metal depositions 6 and delineations were then performed to allow electrical probing of the resistors. As shown in FIG. 2, in order to determine the degree of anisotropy in the films after processing, the resistance between orthogonal opposite pairs A and B and C and D of apertures on each edge of the annealed film was measured. For isotropic films, the two resistance values should be equal. The greater the difference in the two resistances, the greater the anisotropy. The average of the wafers of lot 1 is given in Table 1.

COMPARATIVE EXAMPLE 1

In order to duplicate the recrystallized polysilicon films of conventional techniques, and compare them with the performance of the wafers prepared according to this invention, a second lot 2 of wafers was prepared in identical fashion to the wafers of lot 1. However, the wafers of lot 2 were scanned only in one direction, no cross-scanning occurring. In contrast to the cross-scanned wafers, each of the single-scanned wafers of comparative Example 1 received a dose of 1E14 ions/cm$^2$.

The wafers were thereafter processed in a fashion identical to the wafers of lot 1, and identical measurements taken.

As can be seen from the comparison in Table 1, the cross-scanning technique of this invention has reduced the anisotropy introduced by conventional processes from a level which would be considered unacceptable for integrated circuit use to a level which is tolerable. Table 1 also suggests that the cross-scanning has increased the grain size over uni-directional scanning, as evidenced by the lower sheet resistance, in spite of the fact that the cross-scanned wafers were implanted with only one-half the dose of phosphorous of the uni-directionally scanned wafers.

TABLE 1

|  | Scanning Technique Employed | Resistance Across First Set of Paired Opposite Aperture ohms/□ | Resistance Across Second Set of Paired Opposite Aperture ohms/□ | % Difference |
| --- | --- | --- | --- | --- |
| Example 1 | Cross-Scanning | 637.9 | 629.9 | 1.37 |
| Comparative Example | Uni-Directional | 894.3 | 838.1 | 6.37 |

The invention has been described with respect to particular embodiments thereof. It will be apparent that many variations within the scope of this invention will occur to those of skill in the art. Particularly variations in the angle of scanning direction and particular type of laser employed will be apparent without the exercise of inventive facility.

What is claimed is:

1. A polysilicon thin film semiconductor device precursor of reduced anisotropy, comprising:
    a substrate with a polysilicon thin film deposited thereover which film has been scanned a first time by a laser beam in a first direction to produce relatively long, thin crystallites having a long axis oriented generally parallel to the direction of said first scan, and scanned a second time by a laser beam in a direction at a bias to said first direction, whereby the recrystallized crystallites of the polysilicon thin film are caused to grow in the direction of said second scanning.

2. The polysilicon thin film semiconductor device precursor of claim 1, wherein sad second scanning of said polysilicon film is at an angle of 90° to the direction of said first scanning.

3. The polysilicon thin film semiconductor device precursor of claim 1, wherein the resistance across said polysilicon thin film in a first direction is substantially equal to the resistance of the polysilicon thin film in the direction at right angle to the direction of said first resistance.

4. The polysilicon thin film semiconductor device precursor of claim 3, wherein the difference between said first and said second resistances is no greater than 2%.

5. A polysilicon thin film semiconductor device precursor of reduced anisotropy, produced by a process which includes scanning the precursor with a laser beam in a first direction, followed by scanning the precursor a second time in a second direction at a bias to said first direction, comprising:
    a substrate with a polysilicon thin film deposited thereover, said film comprising recrystallized crystallites having a first angle of orientation generally aligned in the direction of said first scan, and having a second angle of orientation generally aligned in the direction of said second scan.

* * * * *